(12) United States Patent  
Coe et al.

(10) Patent No.: US 7,947,536 B2  
(45) Date of Patent: May 24, 2011

(54) PROCESS FOR FORMING ENCAPSULATED ELECTRONIC DEVICES

(75) Inventors: Nigel Morton Coe, Santa Barbara, CA (US); Kyle D. Frischknecht, Goleta, CA (US); Charles D. Lang, Goleta, CA (US); Matthew Stainer, Goleta, CA (US); Raymond S. Pflanzer, Santa Barbara, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 12/323,642

(22) Filed: Nov. 26, 2008

(65) Prior Publication Data

US 2011/0081735 A1  Apr. 7, 2011

Related U.S. Application Data

(60) Provisional application No. 60/990,951, filed on Nov. 29, 2007.

(51) Int. Cl.  
*H01L 21/00* (2006.01)

(52) U.S. Cl. ................................... 438/127; 257/E51.02

(58) Field of Classification Search .................. 438/127; 257/E51.02  
See application file for complete search history.

(56) References Cited

U.S. PATENT DOCUMENTS

| 6,670,645 | B2 | 12/2003 | Grushin et al. |
|---|---|---|---|
| 6,953,705 | B2 | 10/2005 | Prakash |
| 7,151,342 | B2 * | 12/2006 | Sellars et al. ................. 313/509 |
| 7,166,368 | B2 | 1/2007 | Lecloux et al. |
| 7,235,420 | B2 | 6/2007 | Prakash et al. |
| 2004/0102577 | A1 | 5/2004 | Hsu et al. |
| 2004/0127637 | A1 | 7/2004 | Hsu et al. |
| 2005/0205860 | A1 | 9/2005 | Hsu et al. |
| 2005/0238803 | A1 | 10/2005 | Tremel et al. |
| 2006/0144276 | A1 | 7/2006 | MacPherson et al. |
| 2006/0145598 | A1 | 7/2006 | MacPherson et al. |
| 2006/0283546 | A1 | 12/2006 | Tremel et al. |
| 2006/0284556 | A1 | 12/2006 | Tremel et al. |

OTHER PUBLICATIONS

Kirk-Othmer Encyclopedia of Chemical Technology, Fourth Edition, vol. 18, pp. 837-860, 1996 Y. Wang.

* cited by examiner

*Primary Examiner* — W. David Coleman

(57) ABSTRACT

There is provided herein a process for forming an encapsulated electronic device. The device has active areas and sealing areas on a substrate. The process includes providing the substrate; forming a discontinuous pattern of a material having a first surface energy on at least a portion of the sealing areas; forming multiple active layers, where at least one active layer is formed by liquid deposition from a liquid medium having a surface energy greater than the first surface energy; providing an encapsulation assembly; and bonding the encapsulation assembly to the substrate in the sealing areas. Also provided are devices formed by the disclosed processes.

19 Claims, 6 Drawing Sheets

US 7,947,536 B2

PROCESS FOR FORMING ENCAPSULATED ELECTRONIC DEVICES

RELATED APPLICATION DATA

This application claims priority under 35 U.S.C. §119(e) from Provisional Application No. 60/990,951 filed on Nov. 29, 2007, which is incorporated by reference in its entirety.

FIELD OF THE DISCLOSURE

This disclosure relates in general to a process for forming an encapsulated electronic device. In particular, it relates to devices that are formed at least in part by liquid processing techniques and encapsulated to prevent exposure of the electronic devices to environmental contaminants.

BACKGROUND INFORMATION

Many electronic devices require protection from moisture, and in some cases oxygen, hydrogen, and/or organic vapors to prevent various types of degradation. Such devices include organic light-emitting diode ("OLED") devices based on polymer or small molecule construction, microelectronic devices based on silicon IC technology, and MEMS devices based on silicon micro-machining. Exposure to the atmosphere can cause cathode degradation by oxide or hydroxide formation (leading to decreased performance/luminance), corrosion or stiction, respectively. In addition, the active materials in the device may be subject to degradation by moisture and other contaminant gases. Current techniques for protecting organic electronic devices from such degradation include applying an environmental barrier coat to the outside of the organic electronic device, putting an absorbent or adsorbent getter material on the edges of the device where contaminants enter into the interior of the organic electronic device or within an enclosure containing the organic electronic device to enclose the materials most sensitive to contaminant gases with the getter material.

In all cases, the sealing area for the device must be clean and free of organic debris prior to the sealing step in order to provide a continuous, leak-free seal. When active materials are applied by liquid processing techniques, they can be deposited in the sealing areas as well as the active areas of the substrate. It is sometimes difficult to remove them from the sealing areas.

SUMMARY OF THE DISCLOSURE

There is provided herein a process for forming an encapsulated electronic device, said device comprising active areas and sealing areas on a substrate, said process comprising:
  providing the substrate;
  forming a discontinuous pattern of a material having a first surface energy on at least a portion of the sealing areas;
  forming multiple active layers, wherein at least one active layer is formed by liquid deposition from a liquid medium having a surface energy greater than the first surface energy;
  providing an encapsulation assembly;
  bonding the encapsulation assembly to the substrate in the sealing areas.

In some embodiments, there is an additional step of cleaning the sealing areas prior to bonding the encapsulation assembly.

In some embodiments, when the material having a first surface energy is treated with anisole, the resulting contact angle is at least 40°.

In some embodiments, the material having a first surface energy is fluorinated.

In some embodiments, the active layer formed by liquid deposition comprises an electroluminescent organic compound.

There is also provided a process for forming an encapsulated organic light-emitting diode, the process comprising:
  providing a substrate having an active area and sealing area;
  providing a multiplicity of first electrode structures on the substrate in the active area;
  forming a first charge transport layer over the electrode structures in at least the active area;
  forming a discontinuous pattern of a material having a first surface energy on at least a portion of the sealing area;
  forming at least one photoactive layer comprising a luminescent metal complex by liquid deposition from a liquid composition, wherein the liquid composition has a second surface energy that is greater than the first surface energy;
  forming a second charge transport layer in at least the active area;
  forming a second electrode in at least the active area;
  cleaning the sealing area;
  providing an encapsulation assembly; and
  bonding the encapsulation assembly to the substrate in the sealing areas.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

DETAILED DESCRIPTION

Figure 1:
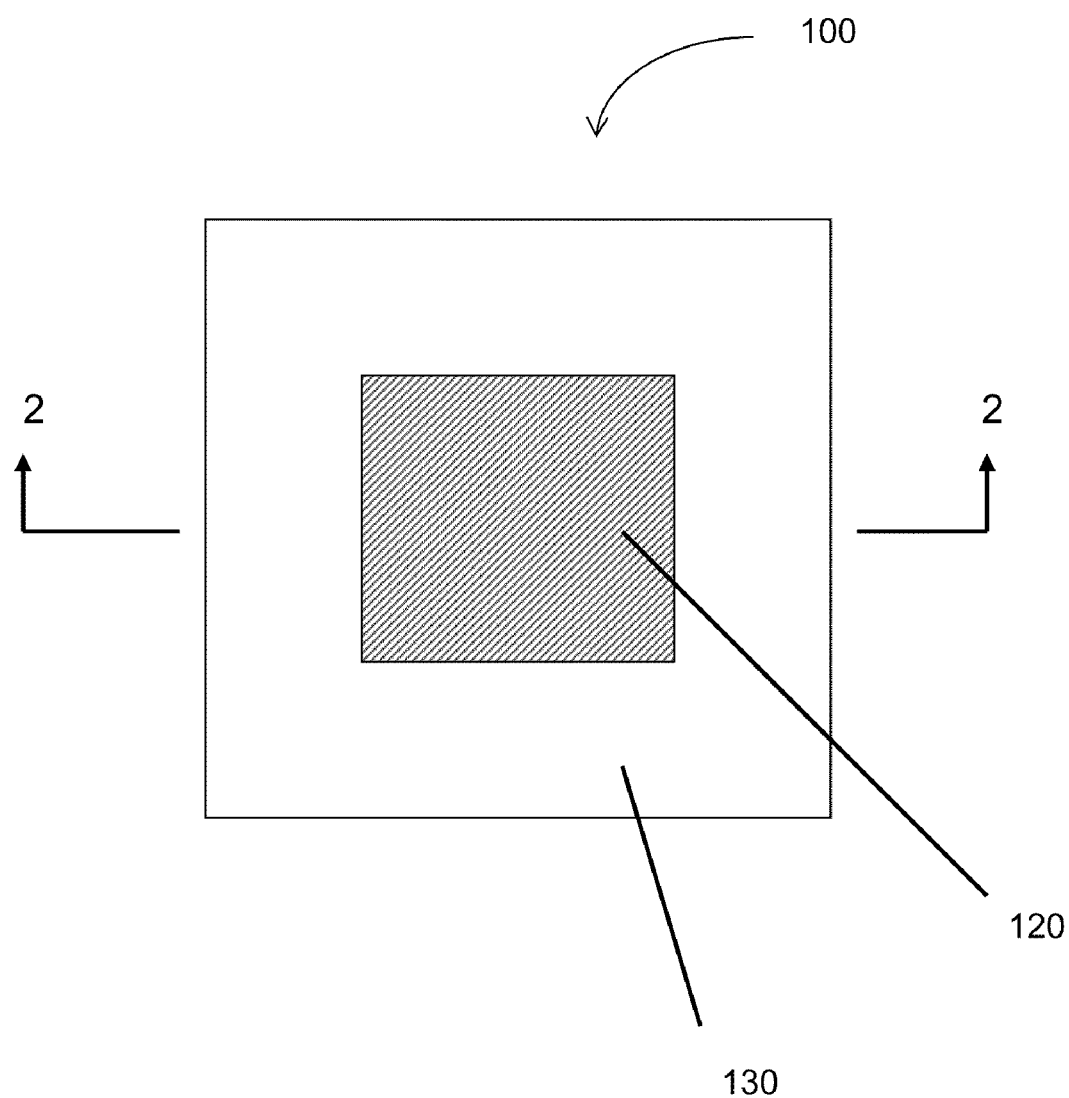
FIG. 1 includes plan view of an electronic device.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by Encapsulation, the Discontinuous Pattern, the Active Material, the Process for Forming an Encapsulated OLED.

1. DEFINITIONS AND CLARIFICATION OF TERMS

Before addressing details of embodiments described below, some terms are defined or clarified.

As used herein, the term "active" when referring to a layer or material, is intended to mean a layer or material that exhibits electronic or electro-radiative properties. In an electronic device, an active material electronically facilitates the operation of the device. Examples of active materials include, but are not limited to, materials which conduct, inject, transport, or block a charge, where the charge can be either an electron or a hole, and materials which emit radiation or exhibit a change in concentration of electron-hole pairs when receiving radiation. Examples of inactive materials include, but are not limited to, planarization materials, insulating materials, and environmental barrier materials.

The term "active area" or "electronic active area" is intended to mean an area of a substrate, which from a plan view, is occupied by one or more circuits, one or more electronic components, or a combination thereof.

The term "adhesive" is intended to mean a solid or liquid substance that is capable of holding materials by surface attachment. Examples of adhesives include, but are not limited to, materials that are organic and inorganic, such as those using ethylene vinyl acetates, phenolic resins, rubber (natural and synthetic), carboxylic polymers, polyamides, polyimides, styrene-butadiene, silicone, epoxy, urethane, acrylic, isocyanoate, polyvinyl acetates, polyvinyl alcohols, polybenzimidazole, cement, cyanoacrylate and mixtures and combinations thereof.

The term "barrier material" is intended to mean a material that substantially prevents the passage of contaminants of concern (e.g., air, oxygen, hydrogen, organic vapors, moisture) therethrough under the conditions in which the final device will likely be exposed to. Examples of materials useful to create barrier materials include, but are not limited to, glasses, ceramics, metals, metal oxides, metal nitrides, carbides, and combinations thereof.

The term "bond" and its various forms is used interchangeably with the term "seal" and is intended to mean to permanently affix one surface to another.

The term "ceramic" is intended to mean an inorganic composition, other than glass, which can be heat treated in order to harden the inorganic composition during its manufacture or subsequent use by firing, calcining, sintering, or fusion of at least a portion of the inorganic material, fired clay compositions which form, e.g., porcelain or brick, and refractories.

The term "discontinuous" when referring to a material, is intended to mean that the material is present in a pattern which includes gaps where there is no coverage. The discontinuities can be regular or irregular in shape and frequency. In some embodiments, a discontinuous material is present as a multiplicity of islands.

The term "electronic device" is intended to mean a collection of circuits, electronic components, or combinations thereof that collectively, when properly connected and supplied with the appropriate potential(s), performs a function. An electronic device may include or be part of a system. Examples of electronic devices include displays, sensor arrays, computer systems, avionics, automobiles, cellular phones, and many other consumer and industrial electronic products.

The term "encapsulation assembly" is intended to mean one or more structures that can be used to cover, enclose, and at least forms part of a seal for one or more electronic components within an electrically active area of a substrate from ambient conditions. In conjunction with a substrate that includes one or more electronic components, the encapsulation assembly substantially protects a portion of such electronic component(s) from damage originating from a source external to the electronic device. In some embodiments, a lid, by itself, or in combination with one or more other objects, can form an encapsulation assembly.

The term "getter material" is intended to mean a material that is used to absorb, adsorb, or chemically tie up one or more undesired materials, such as water, oxygen, hydrogen, organic vapor and mixtures thereof. A getter material can be a solid, paste, liquid, or vapor. One type of gettering material can be used in mixtures or combinations of two or more materials.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer.

The term "lid" is intended to mean a structure that, by itself or in combination with one or more other objects, can be used to cover, enclose, and forms at least part of a seal for one or more electronic components within an electrically active area of a substrate from ambient conditions.

The term "ligand" is intended to mean a molecule, ion, or atom that is attached to the coordination sphere of a metallic ion.

The term "liquid composition" is intended to mean a liquid medium in which a material is dissolved to form a solution, a liquid medium in which a material is dispersed to form a dispersion, or a liquid medium in which a material is suspended to form a suspension or an emulsion. "Liquid medium" is intended to mean a material that is liquid without the addition of a solvent or carrier fluid, i.e., a material at a temperature above its solidification temperature.

The term "liquid medium" is intended to mean a liquid material, including a pure liquid, a combination of liquids, a solution, a dispersion, a suspension, and an emulsion. Liquid medium is used regardless whether one or more solvents are present.

The term "metal complex" is intended to mean a chemical compound containing one or more ions, atoms, or molecules bound by coordinate bonds to a central metallic on or atom. The term "metallic" is intended to mean containing one or more metals. For example, a metallic coating can include an elemental metal by itself, a clad, an alloy, a plurality of layers of any combination of an elemental metal, a clad, or an alloy, or any combination of the foregoing.

The term "organic electronic device" is intended to mean a device including one or more semiconductor layers or materials. Organic electronic devices include: (1) devices that convert electrical energy into radiation (e.g., a light-emitting diode, light emitting diode display, diode laser, or lighting panel), (2) devices that detect signals through electronic processes (e.g., photodetectors, photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode).

The terms "over" and "overlying," when used to refer to layers, members or structures within a device, do not necessarily mean that one layer, member or structure is immediately next to or in contact with another layer, member, or structure. Similarly, the terms "under" and "underlying" do not necessarily mean that one layer, member or structure is immediately next to or in contact with another layer, member, or structure. When a first layer is under a second layer and in direct contact with that second layer, it is referred to as "immediately under" or "immediate underlying".

The term "photoactive" refers to a material that emits light when activated by an applied voltage (such as in a light emitting diode or chemical cell) or responds to radiant energy and generates a signal with or without an applied bias voltage (such as in a photodetector).

The term "radiation sensitive" when referring to a material, is intended to mean that exposure to radiation results in at least one chemical, physical, or electrical property change in the material.

The term "substantially continuous" is intended to mean that a structure extends without a break and forms a closed geometric element (e.g., triangle, rectangle, circle, loop, irregular shape, etc.).

The term "substrate" is intended to mean a workpiece that can be either rigid or flexible and may be include one or more layers of one or more materials, which can include, but are not limited to, glass, polymer, metal or ceramic materials or combinations thereof.

The term "surface energy" is intended to mean the energy required to create a unit area of a surface from a material. A characteristic of surface energy is that liquid materials with a given surface energy will not wet surfaces with a lower surface energy.

The term "transparent" is intended to mean the capability to transmit at least seventy percent of radiation at a wavelength or spectrum of wavelengths, e.g., visible light.

As used herein, the terms "comprises," "comprising," "includes," "including," "has," "having" or any other variation thereof, are intended to cover a non-exclusive inclusion. For example, a method, process, article, or apparatus that comprises a list of elements is not necessarily limited only those elements but may include other elements not expressly listed or inherent to such method, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

2. ENCAPSULATION

Electronic devices that may benefit from the use of the new process described herein, include, but are not limited to, light emitting diodes, organic displays, photovoltaic devices, field emission displays, plasma displays, microelectrical mechanical systems, photonic devices, and other electronic devices using integrated circuits (e.g., including, but not limited to accelerometers, gyroscopes, motion sensors). Thus, the size of the encapsulation assembly can be very small and will vary based on the type of electronic device with which it is being used.

Figure 2:
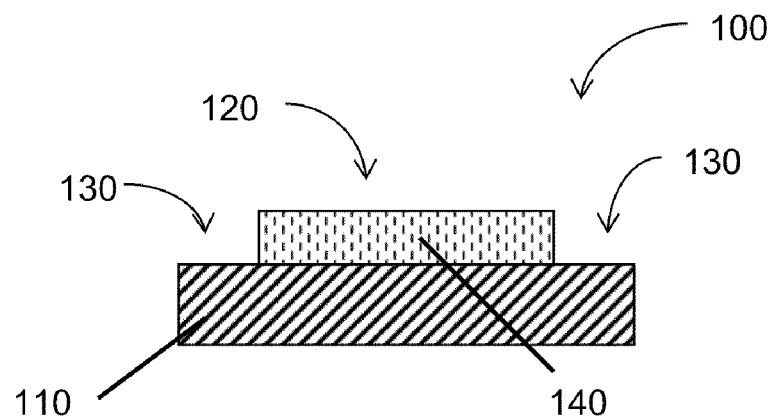
FIG. 2 includes a cross-sectional view of the electronic device taken along line 2-2 in FIG. 1.
Figure 3:
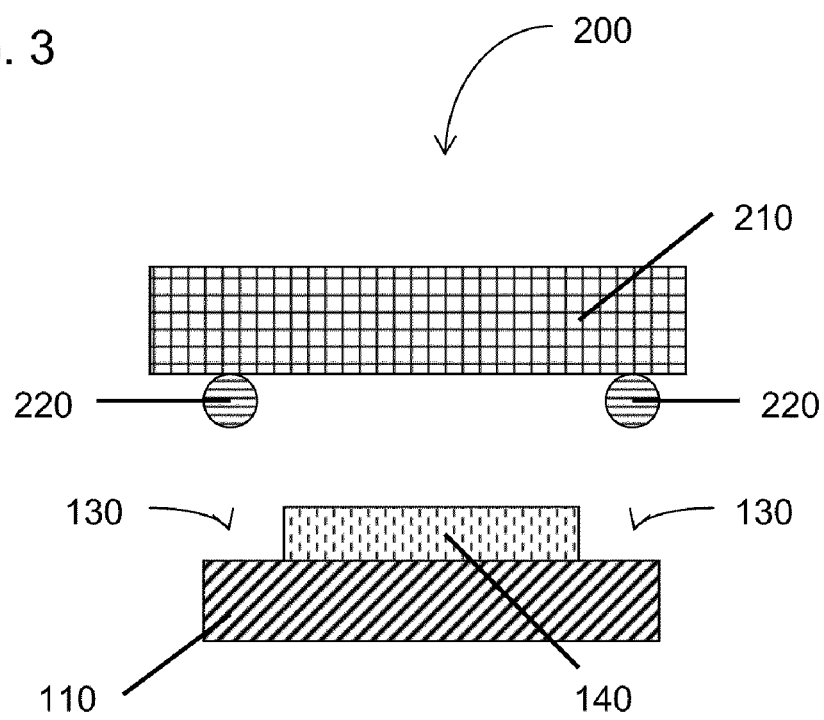
FIG. 3 includes a cross-sectional view of the electronic device and an encapsulation assembly.

Referring to FIG. 1 through FIG. 3, an embodiment of an electronic device is illustrated and is generally designated 100. In a particular embodiment, the electronic device is an organic electronic device, but the electronic device can be any electronic device that includes an interior space that requires sealing. As depicted, in FIG. 1, the electronic device 100 includes active area 120 and sealing area 130. As depicted in FIG. 2, the active layers for the electronic device, shown collectively as 140, are in area 120 on substrate 110. The sealing areas are 130. As depicted in FIG. 3, and encapsulation assembly 200 is provided. The encapsulation assembly has a barrier structure 210 and adhesive material 220. The encapsulation assembly 200 is aligned with the electronic device such that when the two are placed together, the adhesive material is mated with the sealing area. Although the adhesive material is shown as part of the encapsulation assembly in this embodiment, it may also be placed directly on the sealing area of the electronic device.

Prior to the bonding step, the sealing area may be cleaned to remove any organic materials or debris. Any cleaning techniques known to the electronics industry can be used.

The barrier structure can be a cap of metal, glass or ceramic. It may include an interior cavity for placement of a getter material. Such barrier structures are well known in the electronics art. They have been described in, for example, US published applications 2005/0238803, 2006/0283546, and 2006/0284556.

3. THE DISCONTINUOUS PATTERN

A discontinuous pattern of material having a first surface energy is formed on at least a portion of the sealing areas. The material used to form the discontinuous pattern is referred to as the discontinuous pattern material, "DPM". The surface energy of the DPM is lower than the surface energy of the immediate underlying layer. In some embodiments, the immediate underlying layer will be the substrate. In some embodiments, the immediate underlying layer will be an organic layer. The surface energy of the DPM is also lower than at least one liquid composition which is applied in a subsequent step. The surface energy of the liquid composition is greater than the DPM, but not greater than the layer immediately underlying the DPM. Thus, the liquid composition will not wet the areas where the DPM is present, but will wet the immediate underlying areas where no DPM is present.

Figure 4:
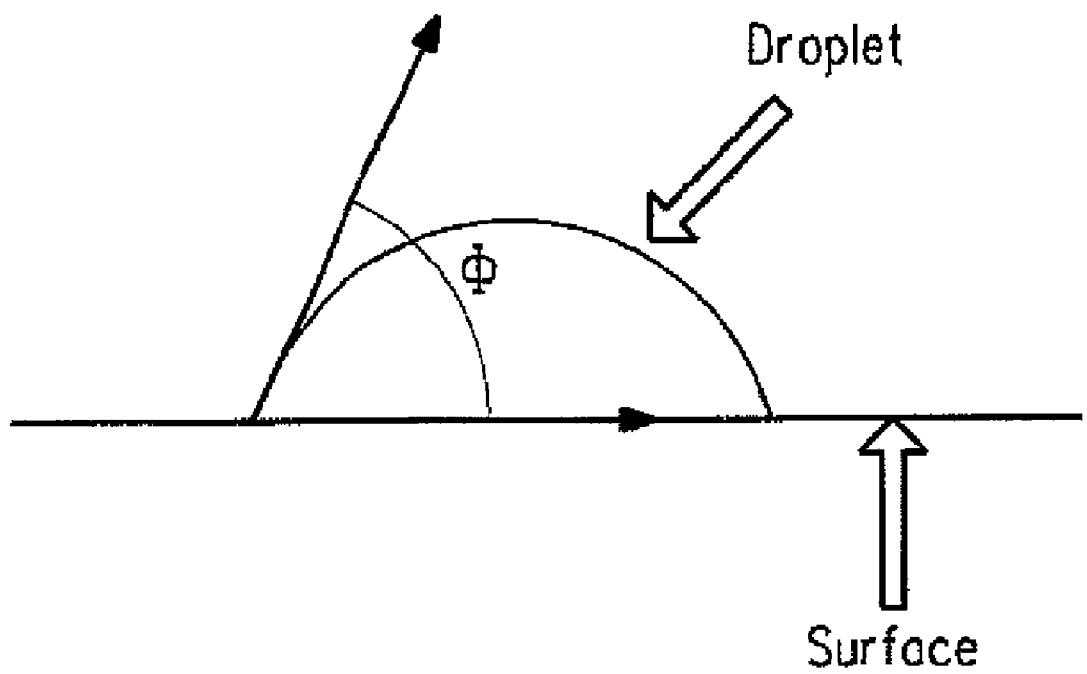
FIG. 4 includes a diagram illustrating contact angle.

One way to determine the relative surface energies, is to compare the contact angle of a given liquid on a layer. As used herein, the term "contact angle" is intended to mean the angle ϕ shown in FIG. 4. For a droplet of liquid medium, angle ϕ is defined by the intersection of the plane of the surface and a line from the outer edge of the droplet to the surface. Furthermore, angle ϕ is measured after the droplet has reached an equilibrium position on the surface after being applied, i.e. "static contact angle". A variety of manufacturers make equipment capable of measuring contact angles. As surface energy decreases, the contact angle for a given liquid will increase. Thus, materials that are less wettable have a higher contact angle.

In some embodiments, the DPM forms films having low surface energy. In some embodiments, when films of the DPM are treated with anisole, the resulting contact angle is at least 40°; in some embodiments, the contact angle is at least 60°; in some embodiments, the contact angle is at least 70°.

Figure 5:
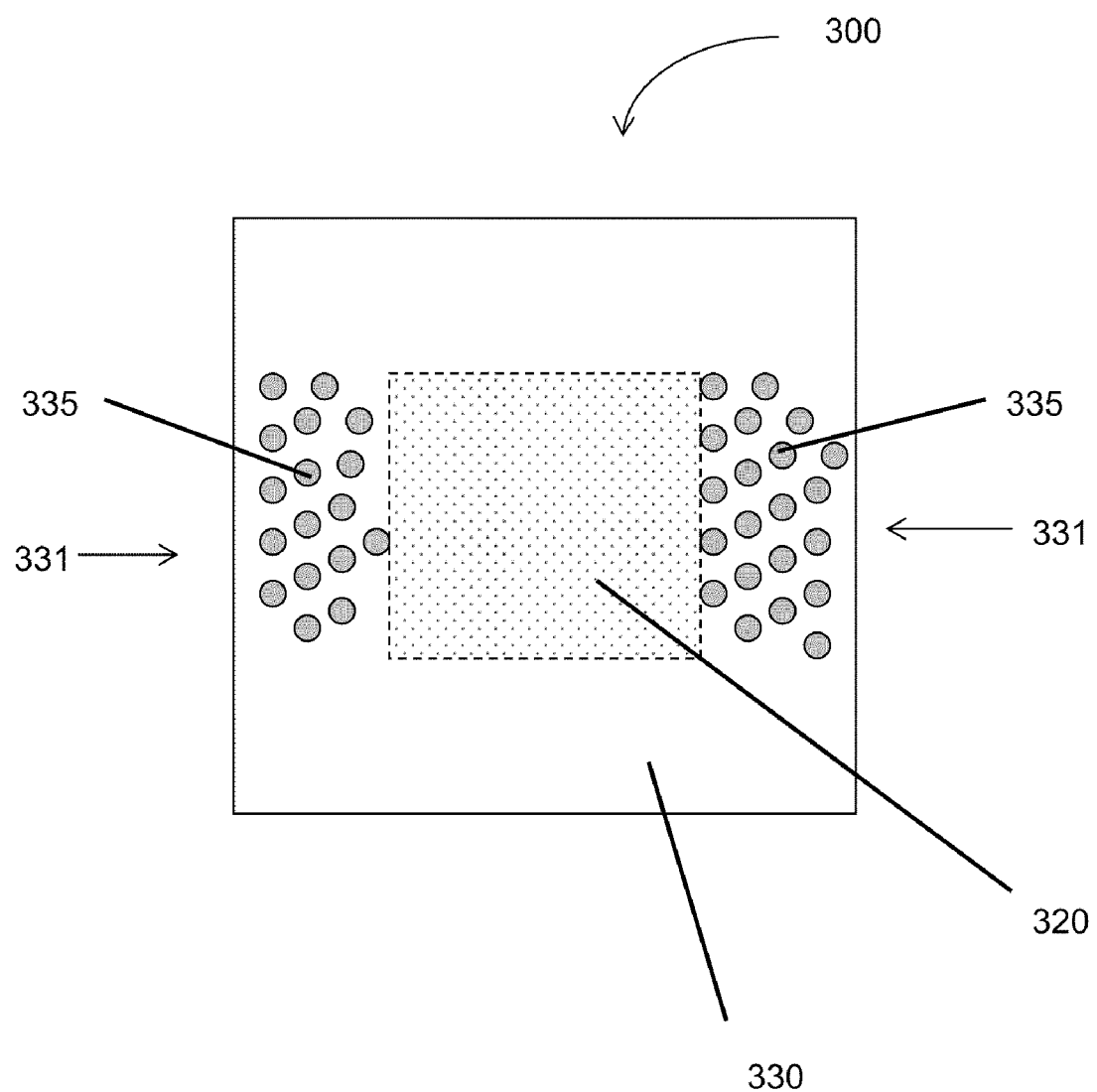
FIG. 5 includes a plan view of an electronic device with a discontinuous pattern of material in a portion of the sealing area.

One example of a discontinuous pattern is illustrated in FIG. 5. Device 300 has an active area 320 surrounded by a sealing area 330. In part of the sealing area there is a discontinuous pattern of material 331. The pattern is an array of islands of material 335.

Figure 6:
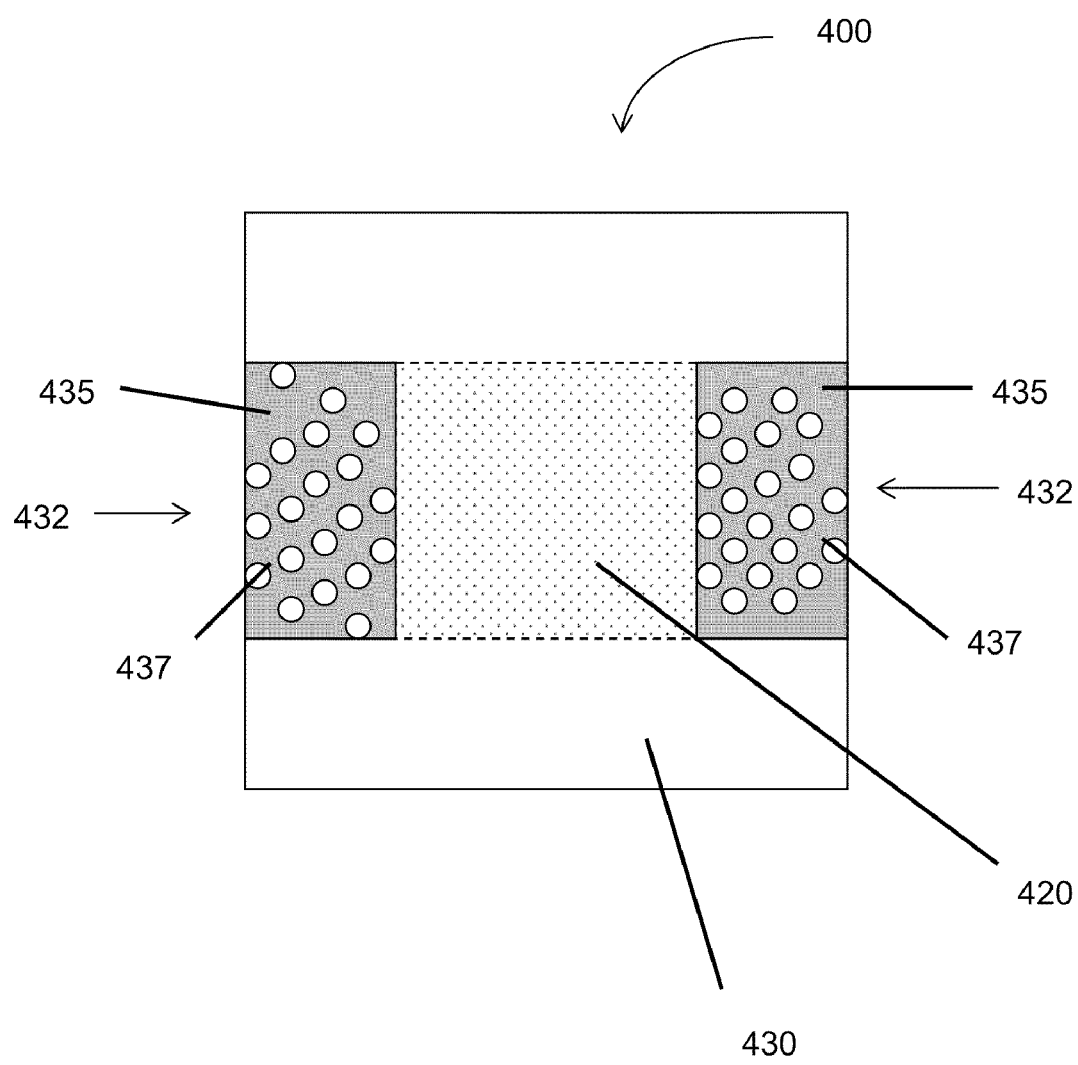
FIG. 6 includes a plan view of part of an electronic device.

Another example of a discontinuous pattern is illustrated in FIG. 6. Device 400 has an active area 420 surrounded by a sealing area 430. In part of the sealing area there is a discontinuous pattern of material 432. The pattern is a film 435 having a regular array of holes, 437.

In some embodiments, the DPM comprises a fluorinated material. In some embodiments, the DPM comprises a material having one or more fluoroalkyl groups. In some embodiments, the fluoroalkyl groups have from 2-20 carbon atoms.

In some embodiments, the DPM is applied in a pattern by vapor deposition through a mask.

In some embodiments, the DPM is applied overall and patterned using standard photolithographic techniques.

In some embodiments, the DPM itself is radiation-sensitive, referred to herein as a reactive DPM. When exposed to radiation, at least one physical property and/or chemical property of the reactive DPM is changed such that the exposed and unexposed areas can be physically differentiated to form a pattern.

In some embodiments, the reactive DPM is a radiation-hardenable composition. In this case, when exposed to radiation, the reactive DPM can become less volatile, less soluble or dispersable in a liquid medium, less tacky, less soft, less flowable, less liftable, or less absorbable. Other physical properties may also be affected.

In some embodiments, the reactive DPM is a radiation-softenable composition. In this case, when exposed to radiation, the reactive DPM can become more volatile, more soluble or dispersable in a liquid medium, more tacky, more soft, more flowable, more liftable, or more absorbable. Other physical properties may also be affected.

The radiation can be any type of radiation to which results in a physical change in the reactive DPM. In some embodiments, the radiation is selected from infrared radiation, visible radiation, ultraviolet radiation, and combinations thereof.

Physical differentiation between areas of the reactive DPM exposed to radiation and areas not exposed to radiation, hereinafter referred to as "development," can be accomplished by any known technique. Such techniques have been used extensively in the photoresist art. Examples of development techniques include, but are not limited to, application of heat (evaporation), treatment with a liquid medium (washing), treatment with an absorbant material (blotting), treatment with a tacky material, and the like.

In some embodiments, the reactive DPM consists essentially of one or more radiation-sensitive materials. In some embodiments, the reactive DPM consists essentially of a material which, when exposed to radiation, hardens, or becomes less volatile, or becomes less soluble, swellable, or dispersible in a liquid medium, or becomes less tacky or absorbable. In some embodiments, the reactive DPM consists essentially of a material having radiation polymerizable groups. Examples of such groups include, but are not limited to olefins, acrylates, methacrylates and vinyl ethers. In some embodiments, the reactive DPM material has two or more polymerizable groups which can result in crosslinking.

In some embodiments, the reactive DPM consists essentially of a material which, when exposed to radiation, softens, or becomes more volatile, or becomes more soluble, swellable, or dispersible in a liquid medium, or becomes more tacky or absorbable. In some embodiments, the reactive DPM consists essentially of at least one polymer which undergoes backbone degradation when exposed to deep UV radiation, having a wavelength in the range of 200-300 nm. Examples of polymers undergoing such degradation include, but are not limited to, polyacrylates, polymethacrylates, polyketones, polysulfones, copolymers thereof, and mixtures thereof.

In some embodiments, the reactive DPM consists essentially of at least one reactive material and at least one radiation-sensitive material. The radiation-sensitive material, when exposed to radiation, generates an active species that initiates the reaction of the reactive material. Examples of radiation-sensitive materials include, but are not limited to, those that generate free radicals, acids, or combinations thereof. In some embodiments, the reactive material is polymerizable or crosslinkable. The material polymerization or crosslinking reaction is initiated or catalyzed by the active species. The radiation-sensitive material is generally present in amounts from 0.001% to 10.0% based on the total weight of the reactive DPM.

In some embodiments, the reactive DPM consists essentially of a material which, when exposed to radiation, hardens, or becomes less soluble, swellable, or dispersible in a liquid medium, or becomes less tacky or absorbable. In some embodiments, the reactive material is an ethylenically unsaturated compound and the radiation-sensitive material generates free radicals. Ethylenically unsaturated compounds include, but are not limited to, acrylates, methacrylates, vinyl compounds, and combinations thereof. Any of the known classes of radiation-sensitive materials that generate free radicals can be used. Examples of radiation-sensitive materials which generate free radicals include, but are not limited to, quinones, benzophenones, benzoin ethers, aryl ketones, peroxides, biimidazoles, benzyl dimethyl ketal, hydroxyl alkyl phenyl acetophone, dialkoxy actophenone, trimethylbenzoyl phosphine oxide derivatives, aminoketones, benzoyl cyclohexanol, methyl thio phenyl morpholino ketones, morpholino phenyl amino ketones, alpha halogennoacetophenones, oxysulfonyl ketones, sulfonyl ketones, oxysulfonyl ketones, sulfonyl ketones, benzoyl oxime esters, thioxanthrones, camphorquinones, ketocoumarins, and Michler's ketone. Alternatively, the radiation sensitive material may be a mixture of compounds, one of which provides the free radicals when caused to do so by a sensitizer activated by radiation. In some embodiments, the radiation sensitive material is sensitive to visible or ultraviolet radiation.

In some embodiments, the reactive DPM is a compound having one or more crosslinkable groups. Crosslinkable groups can have moieties containing a double bond, a triple bond, a precursor capable of in situ formation of a double bond, or a heterocyclic addition polymerizable group. Some examples of crosslinkable groups include benzocyclobutane, azide, oxiran, di(hydrocarbyl)amino, cyanate ester, hydroxyl, glycidyl ether, C1-10 alkylacrylate, C1-10 alkylmethacrylate, alkenyl, alkenyloxy, alkynyl, maleimide, nadimide, tri (C1-4)alkylsiloxy, tri(C1-4)alkylsilyl, and halogenated derivatives thereof. In some embodiments, the crosslinkable group is selected from the group consisting of vinylbenzyl, p-ethenylphenyl, perfluoroethenyl, perfluoroehtenyloxy, benzo-3,4-cyclobutan-1-yl, and p-(benzo-3,4-cyclobutan-1-yl)phenyl.

In some embodiments, the reactive material can undergo polymerization initiated by acid, and the radiation-sensitive material generates acid. Examples of such reactive materials include, but are not limited to, epoxies. Examples of radiation-sensitive materials which generate acid, include, but are not limited to, sulfonium and iodonium salts, such as diphenyliodonium hexafluorophosphate.

In some embodiments, the reactive DPM consists essentially of a material which, when exposed to radiation, softens, or becomes more volatile, or becomes more soluble, swellable, or dispersible in a liquid medium, or becomes more tacky or absorbable. In some embodiments, the reactive material is a phenolic resin and the radiation-sensitive material is a diazonaphthoquinone.

Other radiation-sensitive systems that are known in the art can be used as well.

In some embodiments, the reactive DPM comprises a fluorinated material. In some embodiments, the reactive DPM comprises an unsaturated material having one or more fluoroalkyl groups. In some embodiments, the fluoroalkyl groups have from 2-20 carbon atoms. In some embodiments, the reactive DPM is a fluorinated acrylate, a fluorinated ester, or a fluorinated olefin monomer. Examples of commercially available materials which can be used as reactive DPM materials, include, but are not limited to, Zonyl® 8857A, a fluorinated unsaturated ester monomer available from E. I. du Pont de Nemours and Company (Wilmington, Del.), and 3,3,4,4,5,5,6,6,7,7,8,8,9,9,10,10,11,11,12,12,12-heneicosafluorododecyl acrylate ($H_2C=CHCO_2CH_2CH_2(CF_2)_9CF_3$) available from Sigma-Aldrich Co. (St. Louis, Mo.).

In some embodiments, the reactive DPM is a fluorinated macromonomer. As used herein, the term "macromonomer" refers to an oligomeric material having one or more reactive groups which are terminal or pendant from the chain. In some embodiments, the macromonomer has a molecular weight greater than 1000; in some embodiments, greater than 2000; in some embodiments, greater than 5000. In some embodiments, the backbone of the macromonomer includes ether segments and perfluoroether segments. In some embodiments, the backbone of the macromonomer includes alkyl segments and perfluoroalkyl segments. In some embodiments, the backbone of the macromonomer includes partially fluorinated alkyl or partially fluorinated ether segments. In some embodiments, the macromonomer has one or two terminal polymerizable or crosslinkable groups.

In some embodiments, the reactive DPM is an oligomeric or polymeric material having cleavable side chains, where the material with the side chains forms films with a different surface energy than the material without the side chains. In some embodiments, the reactive DPM has a non-fluorinated backbone and partially fluorinated or fully fluorinated side chains. The reactive DPM with the side chains will form films with a lower surface energy than films made from the reactive DPM without the side chains. Thus, the reactive DPM can be can be applied to a first layer, exposed to radiation in a pattern to cleave the side chains, and developed to remove the side chains. This results in a pattern of higher surface energy in the areas exposed to radiation where the side chains have been removed, and lower surface energy in the unexposed areas where the side chains remain. In some embodiments, the side chains are thermally fugitive and are cleaved by heating, as with an infrared laser. In this case, development may be coincidental with exposure in infrared radiation. Alternatively, development may be accomplished by the application of a vacuum or treatment with solvent. In some embodiment, the side chains are cleavable by exposure to UV radiation. As with the infrared system above, development may be coincidental with exposure to radiation, or accomplished by the application of a vacuum or treatment with solvent.

In some embodiments, the reactive DPM comprises a material having a reactive group and second-type functional group. The second-type functional groups can be present to modify the physical processing properties or the photophysical properties of the reactive DPM. Examples of groups which modify the processing properties include plasticizing groups, such as alkylene oxide groups.

In some embodiments, the reactive DPM reacts with the underlying area when exposed to radiation. The exact mechanism of this reaction will depend on the materials used. After exposure to radiation, the reactive DPM is removed in the unexposed areas by a suitable development treatment. In some embodiments, the reactive DPM is removed only in the unexposed areas. In some embodiments, the reactive DPM is partially removed in the exposed areas as well, leaving a thinner layer in those areas. In some embodiments, the reactive DPM that remains in the exposed areas is less than 50 Å in thickness. In some embodiments, the reactive DPM that remains in the exposed areas is essentially a monolayer in thickness.

In some embodiments, the reactive DPM can be applied with an additional function material. In some embodiments, the reactive DPM is applied after the formation of one or more functional layers.

In some embodiments, the reactive DPM is applied with the active material for an organic active layer. In some embodiments, the reactive DPM is added to the liquid composition used to form the active layer. When the deposited composition is dried to form a film, the reactive DPM migrates to the air interface, i.e., the top surface, of the first layer in order to reduce the surface energy of the system.

In some embodiments, the reactive DPM is applied after the formation one or more active layers. In some embodiments, the reactive DPM is applied as a separate layer overlying, and in direct contact with an active layer.

In some embodiments, the reactive DPM is applied without adding it to a solvent. In some embodiments, the reactive DPM is applied by vapor deposition. In some embodiments, the reactive DPM is a liquid at room temperature and is applied by liquid deposition over the first layer. The liquid reactive DPM may be film-forming or it may be absorbed or adsorbed onto the surface of the first layer. In some embodiments, the liquid reactive DPM is cooled to a temperature below its melting point in order to form a second layer over the first layer. In some embodiments, the reactive DPM is not a liquid at room temperature and is heated to a temperature above its melting point, deposited on the first layer, and cooled to room temperature to form a second layer over the first layer. For the liquid deposition, any method may be used.

In some embodiments, the reactive DPM is deposited from a liquid composition. The liquid deposition method may be continuous or discontinuous. Continuous liquid deposition techniques, include but are not limited to, spin coating, roll coating, curtain coating, dip coating, slot-die coating, spray coating, and continuous nozzle coating. Discontinuous liquid deposition techniques include, but are not limited to, ink jet printing, gravure printing, flexographic printing and screen printing. In some embodiments, the reactive DPM liquid composition is deposited using a continuous liquid deposition method. The choice of liquid medium for depositing the reactive DPM will depend on the exact nature of the reactive DPM material itself. In some embodiments, the reactive DPM is a fluorinated material and the liquid medium is a fluorinated liquid. Examples of fluorinated liquids include, but are not limited to, perfluorooctane, trifluorotoluene, and hexafluoroxylene.

In some embodiments, the reactive DPM treatment comprises a first step of forming a sacrificial layer over the first layer, and a second step of applying a reactive DPM layer over the sacrificial layer. The sacrificial layer is one which is more easily removed than the reactive DPM layer by whatever development treatment is selected. Thus, after exposure to radiation, as discussed below, the reactive DPM layer and the sacrificial layer are removed in either the exposed or unexposed areas in the development step. The sacrificial layer is intended to facilitate complete removal of the reactive DPM layer is the selected areas and to protect the underlying first layer from any adverse affects from the reactive species in the reactive DPM layer.

After deposition of the reactive DPM, the layer is exposed patternwise to radiation. The type of radiation used will depend upon the sensitivity of the reactive DPM as discussed above. As used herein, the term "patternwise" indicates that only selected portions of a material or layer are exposed. Patternwise exposure can be achieved using any known imaging technique. In some embodiments, the pattern is achieved by exposing through a mask. In some embodiments, the pattern is achieved by exposing only select portions with a laser. The time of exposure can range from seconds to minutes, depending upon the specific chemistry of the reactive DPM used. When lasers are used, much shorter exposure times are used for each individual area, depending upon the power of the laser. The exposure step can be carried out in air or in an inert atmosphere, depending upon the sensitivity of the materials.

In some embodiments, the radiation is selected from the group consisting of ultra-violet radiation (10-390 nm), visible radiation (390-770 nm), infrared radiation (770-10$^6$ nm), and combinations thereof, including simultaneous and serial treatments. In some embodiments, the radiation is thermal radiation. In some embodiments, the exposure to radiation is carried out by heating. The temperature and duration for the heating step is such that at least one physical property of the reactive DPM is changed, without damaging any underlying layers of the light-emitting areas. In some embodiments, the heating temperature is less than 250° C. In some embodiments, the heating temperature is less than 150° C.

In some embodiments, the radiation is ultraviolet or visible radiation. In some embodiments, the radiation is applied patternwise, resulting in exposed regions of reactive DPM and unexposed regions of reactive DPM.

In some embodiments, after patternwise exposure to radiation, the first layer is treated to remove either the exposed or unexposed regions of the reactive DPM. Patternwise exposure to radiation and treatment to remove exposed or unexposed regions is well known in the art of photoresists.

In some embodiments, the exposure of the reactive DPM to radiation results in a change in the solubility or dispersibility of the reactive DPM in solvents. When the exposure is carried out patternwise, this can be followed by a wet development treatment. The treatment usually involves washing with a solvent which dissolves, disperses or lifts off one type of area. In some embodiments, the patternwise exposure to radiation results in insolubilization of the exposed areas of the reactive DPM, and treatment with solvent results in removal of the unexposed areas of the reactive DPM.

In some embodiments, the exposure of the reactive DPM to visible or UV radiation results in a reaction which decreases the volatility of the reactive DPM in exposed areas. When the exposure is carried out patternwise, this can be followed by a thermal development treatment. The treatment involves heating to a temperature above the volatilization or sublimation temperature of the unexposed material and below the temperature at which the material is thermally reactive. For example, for a polymerizable monomer, the material would be heated at a temperature above the sublimation temperature and below the thermal polymerization temperature. It will be understood that reactive DPM materials which have a temperature of thermal reactivity that is close to or below the volatilization temperature, may not be able to be developed in this manner.

In some embodiments, the exposure of the reactive DPM to radiation results in a change in the temperature at which the material melts, softens or flows. The exposure step can be followed by a dry development treatment. A dry development treatment can include contacting an outermost surface of the element with an absorbent surface to absorb or wick away the softer portions. This dry development can be carried out at an elevated temperature, so long as it does not further affect the properties of the originally unexposed areas.

After the development step, there is a discontinuous pattern of low surface energy material in at least a portion of the sealing area of the device. The pattern can be regular or irregular.

In some embodiments, the pattern is a regular array of islands of material. The islands may have a regular or irregular shape. In some embodiments, the islands have a shape selected from the group consisting of circular, elliptical, and rectangular.

In some embodiments, the pattern is a film having a regular array of holes in a layer. The holes may have a regular or irregular shape. In some embodiments, the holes have a shape selected from the group consisting of circular, elliptical, and rectangular.

4. THE ACTIVE MATERIAL

In the process described herein, at least one active layer is applied by solution processing techniques after the formation of the discontinuous pattern. The active layer comprises active material and is applied from a liquid composition. The liquid composition has a surface energy that is greater than the surface energy of the material of the discontinuous pattern, DPM. In some embodiments, the active layer comprises at least one metal complex.

In some embodiments, the active layer comprises a photoactive material. In some embodiments, the active layer comprises a photoactive luminescent metal complex. In some embodiments, the metal in the complex is selected from the group consisting of Ir, Pt, Rh, Ru, Os, and Re. In some cases, there is at least one cyclometalating ligand coordinated through one nitrogen atom and one carbon atom. Examples of such photoactive materials are well known, and have been disclosed in, for example, U.S. Pat. Nos. 6,670,645 and 7,166,368. In some embodiments, the luminescent metal complex is a metal chelated oxinoid compound, such as tris(8-hydroxyquinolato)aluminum.

In some embodiments, the photoactive material is present as a dopant in a charge transport host material. In some embodiments, the host is an electron transport material. Such materials are well known, and include, but are not limited to, metal chelated oxinoid compounds, azole compounds, quinoxaline derivatives, and phenanthrolines. In some embodiments, the host is an aryl substituted anthracene. In some embodiments, the host is a bis-condensed cyclic aromatic compound.

The liquid medium can be any liquid in which the photoactive material can be dissolved or dispersed and from which it will form a film. In some embodiments, the liquid medium consists essentially of one or more organic solvents. In some embodiments, the liquid medium consists essentially of water or water and an organic solvent. In some embodiments the organic solvent is an aromatic solvent. In some embodiments, the organic solvent is selected from chloroform, dichloromethane, toluene, anisole, 2-butanone, 3-pentanone, butyl acetate, acetone, xylene, mesitylene, chlorobenzene, tetrahydrofuran, diethyl ether, trifluorotoluene, and mixtures thereof. The photoactive material can be present in the liquid medium in a concentration of 0.2 to 2 percent by weight.

The active material can be applied using any liquid deposition technique, as described above. In some embodiments, the active material is applied using a continuous nozzle deposition technique. Such printing techniques have been described in, for example, published US applications 2006/0145598 and 2006/0144276. When continuous nozzle printing is used, the active material is deposited across the full width of the substrate in the printing direction, including the sealing area.

5. THE PROCESS FOR FORMING AN ENCAPSULATED OLED

In some embodiments, the process described herein is useful for forming organic light-emitting diodes ("OLEDs"). The process comprises:

providing a substrate having an active area and sealing area;

providing a multiplicity of first electrode structures on the substrate in the active area;

forming a first charge transport layer over the electrode structures in at least the active area;

forming a discontinuous pattern of a material having a first surface energy on at least a portion of the sealing area;

forming at least one photoactive layer comprising a metal complex by liquid deposition from a liquid composition, wherein the liquid composition has a second surface energy that is greater than the first surface energy;

forming a second charge transport layer in at least the active area;

forming a second electrode in at least the active area;

cleaning the sealing area;

providing an encapsulation assembly; and bonding the encapsulation assembly to the substrate in the sealing areas.

In the above process, the substrate has thereon a multiplicity of electrode structures. The first charge transport layer is formed over the substrate and electrode structures in at least the active area. In some embodiments, the first charge transport layer is formed over the active area and the sealing area. In some embodiments, the first charge transport layer is formed only in the active area.

A discontinuous pattern of material having a first surface energy is formed over at least the sealing area of the substrate. In some embodiments, the discontinuous pattern is formed in the active area as well as the sealing area of the substrate. In the active area, the discontinuous pattern can be used for chemical containment of the photoactive material in the desired pixel areas. The term "chemical containment" is intended to mean a pattern that contains or restrains the spread of a liquid material by surface energy effects rather than physical barrier structures. The term "contained" when referring to a layer, is intended to mean that the layer does not spread significantly beyond the area where it is deposited. The surface energy of the discontinuous pattern material is lower than the surface energy of the immediate underlying layer. In the sealing area, the immediate underlying layer can be the substrate or it can be the hole transport layer. In the active area, the immediate underlying layer is the hole transport layer. The discontinuous pattern is formed as discussed above. In some embodiments, the pattern is formed by treating the hole transport layer with a reactive DPM, exposing patternwise to radiation, and developing.

At least one photoactive layer comprising a metal complex is formed by liquid deposition of a liquid composition. In some embodiments, the metal complex is luminescent and is the photoactive material in the layer. In some embodiment, the metal complex is a host material and the photoactive layer further comprises a photoactive material. In some embodiments, the photoactive layer comprises a first luminescent metal complex and a second host metal complex. In some embodiments, the liquid composition is deposited by continuous nozzle printing. In these embodiments, the luminescent metal complex is deposited across the full width of the substrate in the printing direction, including the active area and the sealing area. The liquid composition has a surface energy that is higher than that of the DPM, and therefore, in the sealing area, the liquid composition is contained by the discontinuous pattern. The composition remains only in the areas where the DPM is not present.

Figure 7:
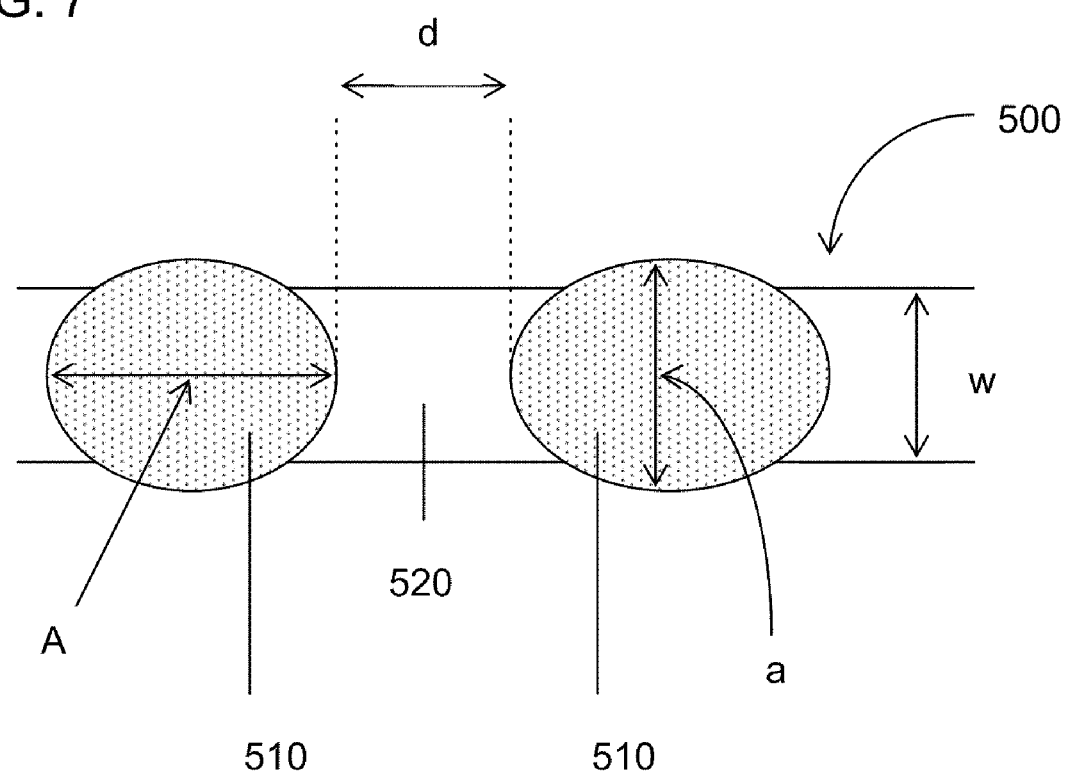
FIG. 7 includes a plan view of a discontinuous pattern.

In some embodiments, the discontinuous pattern in the sealing area comprises a series of regularly spaced holes in the DPM film in the printing lane for the luminescent metal complex composition. This is shown schematically in FIG. 7. The printing lane 500 has a width w. The printing lane width is determined as the width of the material formed by printing with the nozzle on the immediate underlying layer. The discontinuous pattern has a series of elliptical openings 510 in the DPM material 520. The elliptical openings have a major axis A and a minor axis a. The spacing between openings is shown as d. In some embodiments, the following relationships hold:

$a=0.8(w)$ to $1.2(w)$;
$A=1.2(a)$ to $1.8(a)$;
$d=1.5(A)$ to $2.0(A)$.

In some embodiments:

$a=0.85(w)$ to $1.15(w)$;
$A=1.4(a)$ to $1.6(a)$;
$d=1.6(A)$ to $1.8(A)$.

The printing lane can have a width of 50-100 microns.

A second charge transport layer is formed over the photoactive layer. This layer can be formed by any deposition technique, including liquid deposition, vapor deposition, and thermal transfer.

A second electrode is formed over the second charge transport layer. This layer can be formed by any deposition technique, but is generally formed by vapor deposition.

The sealing area is then cleaned to remove organic material and debris. Any cleaning method suitable for electronic devices can be used. Such methods include wet etching, dry etching, and laser ablation. Cleaning methods have been disclosed in, for example, U.S. Pat. Nos. 6,953,705 and 7,235,420. Cleaning, and dry etching in particular, will remove organic material from the sealing area, including the DPM. However, the luminescent metal complex in the photoactive layer is generally not removed. It will remain in the open areas defined by the discontinuous pattern.

An encapsulation assembly is then bonded to the device with adhesive in the sealing area. Any encapsulation assembly and adhesive can be used as discussed above. In some embodiments, the adhesive is a UV curable epoxy. Such materials are well known and widely available. Other adhesive materials can be used so long as they have sufficient adhesive and mechanical strength, and sufficient permeation resistance to reactive environmental species such as, but not limited to, moisture and oxygen. Although luminescent metal complex material remains in the sealing areas, because of the pattern in which the material is contained, the adhesive is able to form a substantially continuous seal between the encapsulation assembly and the device substrate.

In some embodiments, the substrate is transparent. In some embodiments, the substrate is glass. In some embodiments, the substrate is a TFT substrate, by which is meant a substrate including an array of TFTs and/or driving circuitry to make panel function. "TFT" refers to a thin-film transistor and is intended to mean a field-effect transistor in which at least a channel region of the field-effect transistor is not principally a portion of a base material of a substrate.

The substrate has provided thereon a multiplicity of electrode structures. The electrodes may be anodes or cathodes. In some embodiments, the electrodes are formed as parallel strips. Alternatively, the electrodes may be a patterned array of structures having plan view shapes, such as squares, rectangles, circles, triangles, ovals, and the like. Generally, the electrodes may be formed using conventional processes (e.g. deposition, patterning, or a combination thereof).

In an exemplary embodiment, the first electrode is an anode; the first charge transport layer is a hole transport layer; the second charge transport layer is an electron transport layer; and the second electrode is a cathode. In some embodiments, there is an additional organic layer comprising buffer material between the anode and the hole transport layer. In some embodiments, there is an additional layer comprising electron injection material between the cathode and the electron transport layer. In some embodiments, the hole transport layer and/or the electron transport layer comprise two or more layers.

In some embodiments, the first electrode structures are transparent. In some embodiments, the electrodes comprise a transparent conductive material such as indium-tin-oxide (ITO). Other transparent conductive materials include, for example, indium-zinc-oxide (IZO), zinc oxide, tin oxide, zinc-tin-oxide (ZTO), aluminum-tin-oxide (ATO), aluminum-zinc-oxide (AZO), elemental metals, metal alloys, and combinations thereof. In some embodiments, the electrodes are anodes for the electronic device. The electrodes can be formed using conventional techniques, such as selective deposition using a stencil mask, or blanket deposition and a conventional lithographic technique to remove portions to form the pattern. The thickness of the electrode is generally in the range of approximately 50 to 150 nm.

In some embodiments, a first layer comprising buffer material and a second layer comprising hole transport material are formed sequentially by liquid deposition.

The term "buffer layer" or "buffer material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Buffer materials may be polymers, oligomers, or small molecules, and may be in the form of solutions, dispersions, suspensions, emulsions, colloidal mixtures, or other compositions.

The buffer layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The buffer layer can comprise charge transfer compounds, and the like, such as copper phthalocyanine and the tetrathiafulvalene-tetracyanoquinodimethane system (TTF-TCNQ). In some embodiments, the buffer layer is made from a dispersion of a conducting polymer and a colloid-forming polymeric acid. Such materials have been described in, for example, published U.S. patent applications 2004-0102577, 2004-0127637, and 2005/0205860. The buffer layer typically has a thickness in a range of approximately 20-200 nm.

The term "hole transport," when referring to a layer, material, member, or structure is intended to mean such layer, material, member, or structure facilitates migration of positive charge through the thickness of such layer, material, member, or structure with relative efficiency and small loss of charge. Although light-emitting materials may also have some charge transport properties, the term "charge transport layer, material, member, or structure" is not intended to include a layer, material, member, or structure whose primary function is light emission.

Examples of hole transport materials for layer 120 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MT-DATA); N,N'-diphenyl-N,N'-bis(3-methylphenyl)-[1,1'-biphenyl]-4,4'-diamine (TPD); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl]pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. The hole transport layer typically has a thickness in a range of approximately 10-100 nm.

After deposition of the optional buffer layer and hole transport layer, a discontinuous pattern of material is formed in at least a portion of the sealing area. The discontinuous pattern is made from material (DPM) having a relatively low surface energy, as discussed above. The method of depositing and patterning the DPM layer has been discussed above.

"Photoactive" refers to a material that emits light when activated by an applied voltage (such as in a light emitting diode or chemical cell) or responds to radiant energy and generates a signal with or without an applied bias voltage (such as in a photodetector). There can be more than one photoactive material, each of which emits a different color, in order to form a multicolor pixellated device. At least a first photoactive material is a luminescent metal complex as discussed above.

When more than one photoactive material is used, the other photoactive materials can be a luminescent metal complex or any other organic electroluminescent ("EL") material. Non-metallic materials include, but are not limited to, small molecule organic fluorescent compounds, conjugated polymers, and mixtures thereof. The photoactive material can be present alone, or in admixture with one or more host materials. Examples of fluorescent compounds include, but are not limited to, naphthalene, anthracene, chrysene, pyrene, tetracene, xanthene, perylene, coumarin, rhodamine, quinacridone, rubrene, derivatives thereof, and mixtures thereof. Examples of conjugated polymers include, but are not limited to poly (phenylenevinylenes), polyfluorenes, poly(spirobifluorenes), polythiophenes, poly(p-phenylenes), copolymers thereof, and mixtures thereof. The photoactive layer typically has a thickness in a range of approximately 10-200 nm.

"Electron Transport" means when referring to a layer, material, member or structure, such a layer, material, member or structure that promotes or facilitates migration of negative charges through such a layer, material, member or structure into another layer, material, member or structure. Examples of electron transport materials which can be used in the optional electron transport layer, include metal chelated oxinoid compounds, such as tris(8-hydroxyquinolato)aluminum (AlQ), bis(2-methyl-8-quinolinolato)(p-phenylphenolato) aluminum (BAlq), tetrakis-(8-hydroxyquinolato)hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri (phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. The electron-transport layer typically has a thickness in a range of approximately 10-100 nm.

As used herein, the term "electron injection" when referring to a layer, material, member, or structure, is intended to mean such layer, material, member, or structure facilitates injection and migration of negative charges through the thickness of such layer, material, member, or structure with relative efficiency and small loss of charge. The optional electron-transport layer may be inorganic and comprise BaO, Li-containing organometallic compounds, LiF, or $Li_2O$. The electron injection layer typically has a thickness in a range of approximately 1-100 Å.

The cathode is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. The cathode thickness is typically in a range of approximately 30-500 nm.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination.

What is claimed is:

1. A process for forming an encapsulated electronic device, said device comprising active areas and sealing areas on a substrate, said process comprising:
   providing the substrate;
   forming a discontinuous pattern of a material having a first surface energy on at least a portion of the sealing areas;
   forming multiple active layers, wherein at least one active layer is formed by liquid deposition from a liquid medium having a surface energy greater than the first surface energy;
   providing an encapsulation assembly;
   bonding the encapsulation assembly to the substrate in the sealing areas.

2. The process of claim 1, wherein the material having a first surface energy is fluorinated.

3. The process of claim 1, wherein the discontinuous pattern is formed by treating with a radiation-sensitive material, patternwise exposing to radiation, and developing.

4. The process of claim 1, wherein treatment of the material having a first surface energy with anisole results in a contact angle of at least 40°.

5. The process of claim 4, wherein the contact angle is at least 60°.

6. A process for forming an encapsulated organic light-emitting diode, the process comprising:
   providing a substrate having an active area and sealing area;
   providing a multiplicity of first electrode structures on the substrate in the active area;
   forming a first charge transport layer over the electrode structures in at least the active area;
   forming a discontinuous pattern of a material having a first surface energy on at least a portion of the sealing area;
   forming at least one photoactive layer comprising a metal complex by liquid deposition from a liquid composition, wherein the liquid composition has a second surface energy that is greater than the first surface energy;
   forming a second charge transport layer in at least the active area;

forming a second electrode in at least the active area;
cleaning the sealing area;
providing an encapsulation assembly; and
bonding the encapsulation assembly to the substrate in the sealing areas.

7. The process of claim 6, wherein the discontinuous pattern is formed by treating with a radiation-sensitive material, patternwise exposure to radiation, and developing.

8. The process of claim 6, wherein the discontinuous pattern comprises a regular array of islands of material.

9. The process of claim 6, wherein the discontinuous pattern comprises a regular array of holes in a film.

10. The process of claim 6, wherein the photoactive material is applied in multiple printing lanes and the discontinuous pattern is the printing lanes in the sealing area.

11. The process of claim 6, wherein the luminescent metal complex comprises a metal selected from the group consisting of Al, Zr, Ir, Pt, Rh, Ru, Os, and Re.

12. The process of claim 6, wherein the metal complex is a luminescent metal complex having at least one cyclometalating ligand coordinated through one nitrogen atom and one carbon atom.

13. The process of claim 6, wherein the metal complex is a host material.

14. The process of claim 6, wherein the photoactive layer is formed by continuous nozzle printing.

15. The process of claim 6, wherein the sealing area is cleaned by a dry etch process.

16. The process of claim 9, wherein the holes are elliptical.

17. The process of claim 10, wherein the discontinuous pattern comprises a regular array of elliptical holes in a film of material.

18. The process of claim 17, wherein the printing lane has a width w, the elliptical hole has a major axis A and a minor axis a, wherein:
$a=0.8(w)$ to $1.2(w)$;
$A=1.2(a)$ to $1.8(a)$;
$d=1.5(A)$ to $2.0(A)$.

19. The process of claim 18, wherein:
$a=0.85(w)$ to $1.15(w)$;
$A=1.4(a)$ to $1.6(a)$;
$d=1.6(A)$ to $1.8(A)$.

* * * * *